United States Patent
Gillot et al.

(10) Patent No.: US 8,183,474 B2
(45) Date of Patent: May 22, 2012

(54) MICROCOMPONENT PROVIDED WITH A CAVITY DELIMITED BY A CAP WITH ENHANCED MECHANICAL RESISTANCE

(75) Inventors: Charlotte Gillot, Grenoble (FR); Jean-Louis Pornin, Crolles (FR); Emmanuelle Lagoutte, St Marcellin (FR); Fabrice Jacquet, Saint Pierre de Mesage (FR); Sebastien Hentz, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 511 days.

(21) Appl. No.: 12/227,339

(22) PCT Filed: May 21, 2007

(86) PCT No.: PCT/EP2007/054885
§ 371 (c)(1),
(2), (4) Date: Jan. 30, 2009

(87) PCT Pub. No.: WO2007/135128
PCT Pub. Date: Nov. 29, 2007

(65) Prior Publication Data
US 2009/0194309 A1    Aug. 6, 2009

(30) Foreign Application Priority Data
May 22, 2006  (FR) ...................... 06 51876

(51) Int. Cl.
*H05K 7/14* (2006.01)
(52) U.S. Cl. ........................ 174/544; 427/96.5

(58) Field of Classification Search .................. 174/520, 174/544; 427/96.5
See application file for complete search history.

(56) References Cited

U.S. PATENT DOCUMENTS
2004/0173886 A1    9/2004 Carley
2006/0076648 A1 *  4/2006 Gally et al. ............... 257/619

FOREIGN PATENT DOCUMENTS
EP    0525764 A2    2/1993
EP    1101730 A2    5/2001
EP    1640329 A2    3/2006

OTHER PUBLICATIONS

International Search Report for International Patent Application No. PCT/EP2007/054885 (Apr. 10, 2007).
Priliminary Search Report for French Application No. International Patent Application FR06518756 (Dec. 18, 2006).
Tsuchiya et al., "Polysilicon Vibrating Gyroscope Vacuum-encapsulated in an On-chip Micro Chamber," Sensors and Actuators 90:49-55 (2001).

* cited by examiner

*Primary Examiner* — Hung Ngo
(74) *Attorney, Agent, or Firm* — Nixon Peabody LLP (57) ABSTRACT

It consists of a microcomponent comprising a cavity (13) delimited by a cap (12) enclosing an active part (10) supported by a substrate (11). The cap (12) comprises a top wall (12*a*) comprising stiffening means with at least one projecting stiffening member (12*b*), said stiffening member (12*b*) being located between two recessed areas (12*c*) of the top wall (12*a*) and having one end (14) at a distance from the recessed areas (12*c*) without coming into contact with the substrate (11).

20 Claims, 7 Drawing Sheets

MICROCOMPONENT PROVIDED WITH A CAVITY DELIMITED BY A CAP WITH ENHANCED MECHANICAL RESISTANCE

CROSS REFERENCE TO RELATED APPLICATIONS or PRIORITY CLAIM

This application is a national phase of International Application No. PCT/EP2007/054885 entitled "MICROCOMPONENT PROVIDED WITH A CAVITY DELIMITED BY A CAP WITH ENHANCED MECHANICAL RESISTANCE", which was filed on May 21, 2007, and which claims priority of French Patent Application No. 06 51876 filed May 22, 2006.

FIELD OF THE INVENTION

The present invention relates to a microcomponent provided with a cavity delimited by a cap with enhanced mechanical resistance.

The packaging of microelectromechanical systems known as MEMS is now a key to their development. Other electronic, optical or optoelectronic microcomponents may also be concerned by this packaging. Hereinafter, the term microcomponent has been used which in this case covers a microsystem, an electronic, optical or optoelectronic component.

The cavity is generally rendered hermetic to gas and moisture so as to limit their ageing. Dust is also prevented from disturbing their operation, particularly in the case of mobile parts. It may also be required to control the atmosphere inside the cavity for example by introducing a neutral gas therein which will prevent any chemical reaction with the microcomponent or by producing a vacuum. In fact, the oxygen in the ambient air may degrade the contacts thereof. The cap also makes it possible to protect the microcomponent mechanically during the subsequent steps to be applied to same before the completion thereof such as cutting, moulding or during the use thereof.

The cap may be mounted and sealed or be made using thin layer technologies.

STATE OF THE RELATED ART

The thin layer manufacturing technique of the caps of such microcomponents is well known to delimit a controlled atmosphere cavity on top of the active part of the microcomponent. Explanations on this subject may particularly be found in European patent applications EP-A-0 525 764 and EP-A-1 101 730.

Figure 1A:
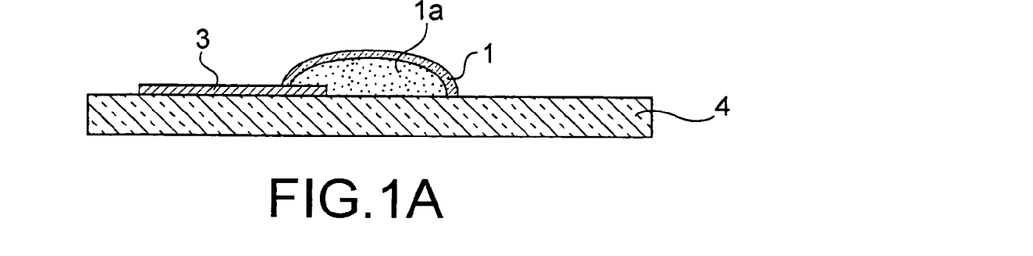
FIGS. 1A to 1D illustrates steps of the production of a microcomponent provided with a cavity delimited by a cap according to the prior art.

A brief description will now be given of a known thin layer production method of a cap intended to protect an active part 1 of a microcomponent arranged on a substrate 4. Reference may be made to FIGS. 1A to 1D. On the active part 1, a layer of a sacrificial material 2 is deposited, which will be shaped and delimited in order to give a shape thereto adapted to that of a cavity 6 which will enclose the active part 1 of the microcomponent. The cavity 6 will be delimited by the cap 7 to be added, this shape corresponds to that of the inside of the cap 7. In the example described, the microcomponent is a MEMS microcomponent and the active part thereof is a beam 1 designed to bend in operation At this stage, the beam 1 is not complete, it has not been released and rests on a sacrificial layer 1a which is arranged on the substrate 4. FIG. 1A illustrates the active part 1 before the deposition of the sacrificial layer 2 and FIG. 1B afterwards.

The sacrificial layer 2 designed to give the inner shape of the cap 7 rests on a beam 1 movement control wire 3. It comprises, at a location offset from the beam 1 on the substrate 4 a thinner part 5. This part 5 will correspond to the inside of a release channel 8 which will subsequently be created and which will be used to evacuate the sacrificial material positioned around the beam 1 and occupying the volume of the cavity 6 delimited by the cap 7.

Figure 1B:
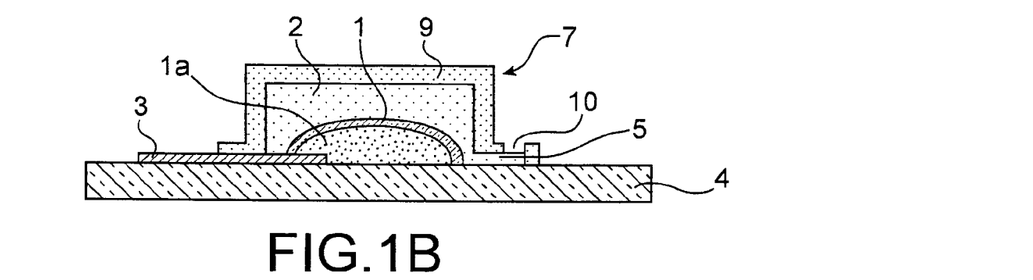
Figure 1C:
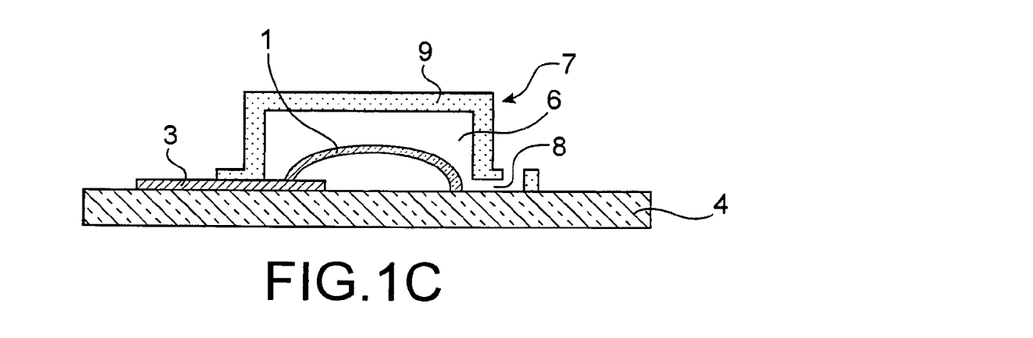
Figure 1D:
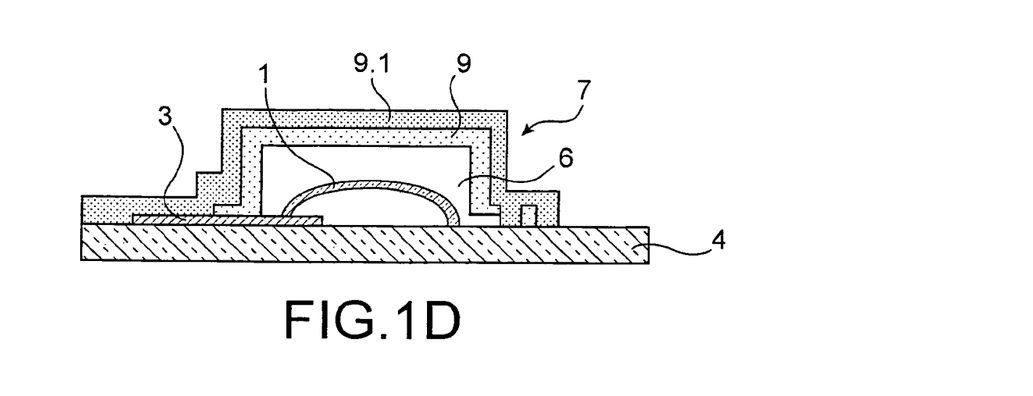

On the sacrificial layer 2, a cap layer 9 is then deposited, which creates the walls of the cap 7. This step is illustrated in FIG. 1B. On the thinner part 5, the cap layer 9 forms the release channel 8. It is envisaged to etch at least one evacuation orifice 10 in the cap layer 9. The sacrificial material is removed by evacuating it via the orifice 10. This can be seen in FIG. 10. On the assembly obtained in FIG. 1C, a sealing layer 9.1 is deposited, which covers the cap 7 and seals the evacuation hole 10. Reference may be made to FIG. 1D.

From a mechanical point of view, such a cap 7 must be able to withstand differences in pressure between the inside and outside thereof, undergoing as little deformation as possible. If the deflection of the cap 7 is excessive, it may come into contact with the active part 1, affect its progression or even damage it. The difference in pressure between the inside and outside of the cap 7 may be associated with the medium wherein it is encapsulated. It may consist of vacuum or a different pressure to the ambient pressure. This ambient pressure may be different to the atmospheric pressure depending on the envisaged application. It should be noted that, in order to complete the microcomponent, after producing the cap 7, it may be necessary to coat it with plastic or mould it and these steps are performed at high pressures of up to $10^7$ Pascal.

The thickness of thin layer caps produced is typically within a range from a few micrometres to a few dozen micrometres. The deformation thereof under the effect of pressure may be significant. In order to increase the mechanical resistance of the cap, it has been proposed to select a material for the cap which displays a satisfactory rigidity and adjust the thickness thereof carefully. In the U.S. patent application 2004/0173886, it is recommended to produce a multilayer cap including alumina. However, rigid materials which are suitable for their mechanical properties are not necessarily commonly used in microelectronics and in microsystems and the introduction thereof may be difficult to implement, they may pose contamination problems or require specific developments.

It has also been proposed to place pillars in the cavity delimited by the cap to support the cap wall. Reference may be made to the document "Polisilicon vibrating gyroscope vacuum-encapsulated in an on-chip micro-chamber" Toshiyuki Tsuchiya et al., Sensors and Actuators A90, 2001, pages 49 to 55. In this configuration, the cap rests on a large number of small pillars which limit the deflection thereof. The additional space occupied due to the presence of the pillars is a non-negligible drawback. In addition, Ate design of the microsystem is limited as it is necessary to account for the position of the pillars. Moreover, in some cases, It is not possible to anchor the pillars on the substrate which forms the base of the cavity.

DESCRIPTION OF THE INVENTION

The aim of the invention is specifically to propose a microcomponent provided wlth a cavity delimited by a cap wherein the mechanical resistance is enhanced and which does not involve the drawbacks mentioned above and particularly does not involve the stress generated by the pillars inside the cavity and which is easy to manufacture using conventional thin layer deposition techniques.

In order to achieve these aims, the invention relates more specifically to a microcomponent comprising a cavity delimited by a cap enclosing an active part supported by a substrate. The cap comprises a top wall comprising stiffening means with at least one projecting stiffening member, said projecting stiffening member being located between two recessed areas of the top wall and having one end at a distance from the recessed areas without coming into contact with the substrate.

The projecting stiffening member may advantageously take the form of a moulding or a block.

The moulding or block may have a rectangular, trapezoidal or rounded cross-section.

The top wall may be provided with several substantially parallel mouldings along the edge of the wall.

In an alternative embodiment, the top wall may be provided with two mouldings arranged crosswise.

According to another embodiment, the top wall may be provided with several honeycombed mouldings.

According to another embodiment, the top wall may be provided with a plurality of blocks arranged in a matrix.

The projection of the stiffening member may be a thickening of the top wall.

According to another embodiment, the projection of the stiffening member may be formed by a curvature of the top wall.

The projecting stiffening member is facing either the inside or the outside of the cavity.

The end of the projecting stiffening member may be free.

In a particularly mechanically advantageous embodiment, the cap may comprise a lining wall which lines the top wall, the end of the projecting stiffening member being in contact with the lining wall.

In the top wall and in the lining wall, if it is present, at least one orifice is provided, the orifice of the top wall and the orifice of the lining wall communicating with each other.

The orifice of the outermost wall of the cap, between the top wall and the lining wall, is flanked by a plug.

The present invention also relates to a method for manufacturing a cavity of a microcomponent delimited by a cap defined in this way. It comprises the following steps:
- deposition of sacrificial material on the substrate and on the active part of the microcomponent,
- delimitation of the sacrificial material and production on the surface of at least one reverse hollow pattern of that of the projecting stiffening member of the stiffening means,
- deposition on the sacrificial material of at least one cap layer forming the cap and the top wall,
- creation of at least one orifice in the cap layer,
- evacuation of the sacrificial material via the orifice,
- sealing of the orifice.

The hollow pattern may be produced by means of embossing in the sacrificial material.

The sacrificial material may be deposited In several layers including a first so-called channel layer which is used to model a sacrificial material evacuation channel, arranged on the periphery of the cavity.

The sacrificial material may be deposited in several layers including a main sacrificial layer which is partially used as a mould for the cap, said sacrificial layer being topped by a structuring sacrificial layer wherein the hollow pattern is produced.

It is possible to deposit at least one lining layer on the main sacrificial layer, before the deposition of the structuring sacrificial layer, said lining layer serving to produce the lining walls.

At least one orifice is produced in the lining layer for the evacuation of the sacrificial material, said orifice communicates with the cap layer orifice.

The orifice of the cap layer may be sealed by depositing at least one sealing layer on the cap layer.

It is possible to etch the sealing layer with the exception of a region above the orifice to produce a plug located on top of the orifice.

BRIEF DESCRIPTION OF THE FIGURES

The present invention will be understood more clearly on reading the description of examples of embodiments which are given solely as an Indication and are in no way limitative, with reference to the appended figures wherein:

FIGS. 3A to 3G illustrate an example of steps of the production of a microcomponent provided with a cavity delimited by a cap according to the invention;

Identical, similar or equivalent parts of the various figures described hereinafter bear the same numeric references so as to facilitate the transition from one figure to another.

The different parts represented in the figures are not necessarily represented according to a uniform scale, in order to render the figures more legible.

DETAILED DESCRIPTION OF SPECIFIC EMBODIMENTS

Reference will now be made to FIGS. 2A to 2F which illustrate examples of microcomponents according to the invention.

The microcomponent according to the invention comprises an active part 10, for example an actuator, a resonator or any other electronic, optical, optoelectronic or electromechanical component, supported by a substrate 11. A cap 12 covers the active part 10 and delimits a cavity 13 wherein the active part 10 is enclosed. The cap 12 rests on the substrate 11. It comprises a top wall 12a which extends along a top part of the cavity 13 and which is substantially facing the active part 10. The top wall 12a comprises stiffening means formed by at least one projecting stiffening member 12b. Said projecting stiffening member 12b is located between two recessed areas 12c of the top wall 12a. The projecting stiffening member 12b has one end 14 which projects from the recessed areas 12c and said end 14 is located beyond the active part 10 with respect to the substrate 11. This end 14 is at a distance from the recessed areas 12c. If the active part 10 is liable to move, neither the projecting stiffening member 12b, nor the recessed areas 12c obstruct the active part 10 during the movements thereof. In addition, the end 14 thereof is not in contact with the substrate 11 either. The projecting stiffening member 12b cannot be compared to a pillar. The protecting end 14 may be free as in FIGS. 2A to 2E. The projecting stiffening member 12b may be projected towards the inside of the cavity 13 as in FIGS. 2B, 2F or, on the other hand, towards the outside of the cavity 13 as in FIGS. 2A, 2C. The top wall 12a may be plane as in FIGS. 2A, 2B, 2C, 2F or convex as in FIGS. 2D, 2E.

The projecting stiffening member 12b may take the form of a moulding or a block. If there are several blocks, they may be arranged in rows and columns. If there are several mouldings, they may be substantially parallel or intersect.

Figure 2A:
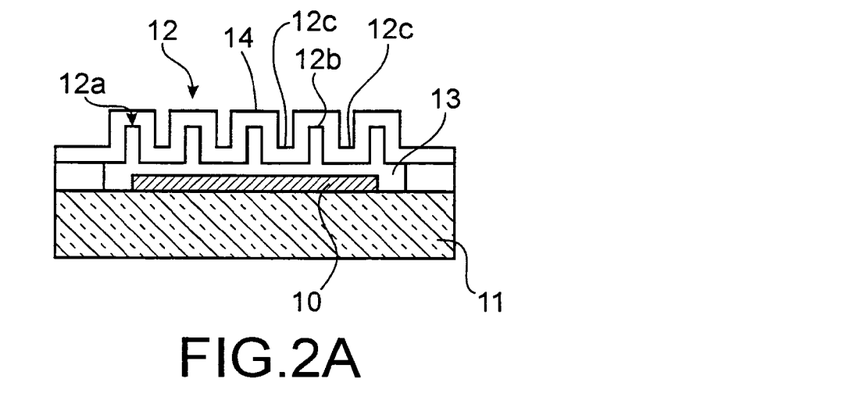
FIGS. 2A to 2F are examples, in a sectional view, of a microcomponent provided with a cavity delimited by a cap according to the invention.
Figure 2B:
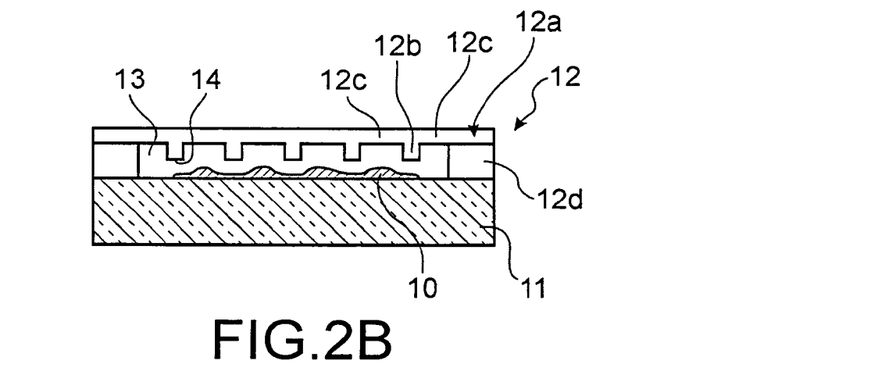
Figure 2C:
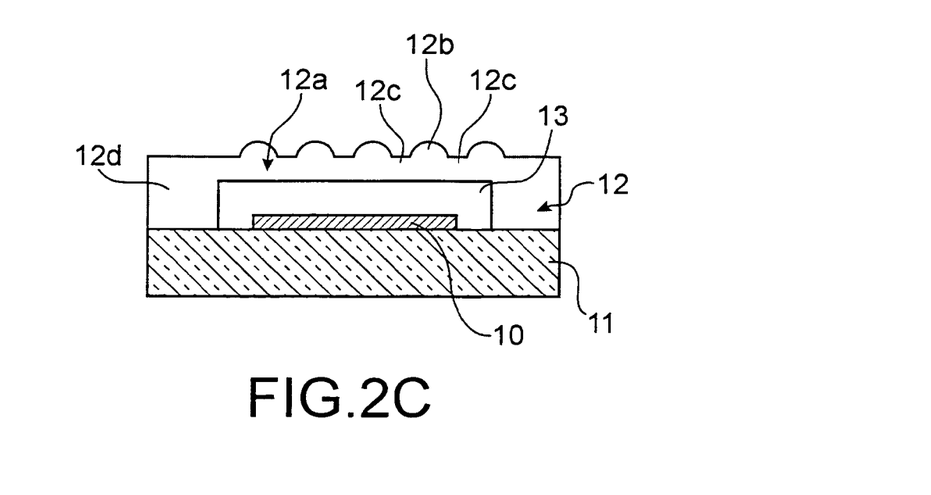
Figure 2D:
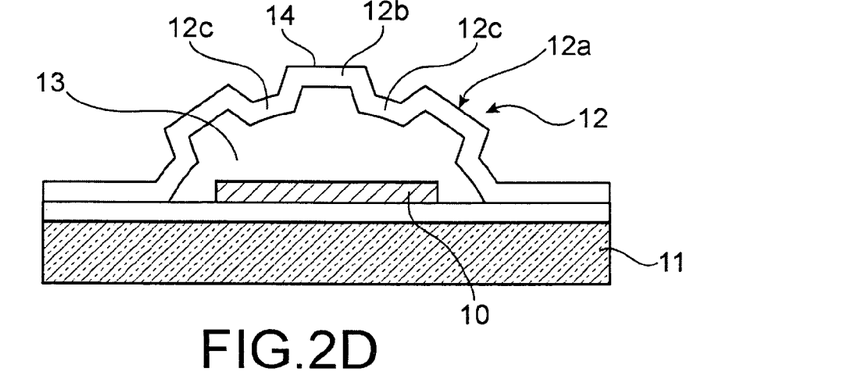
Figure 2E:
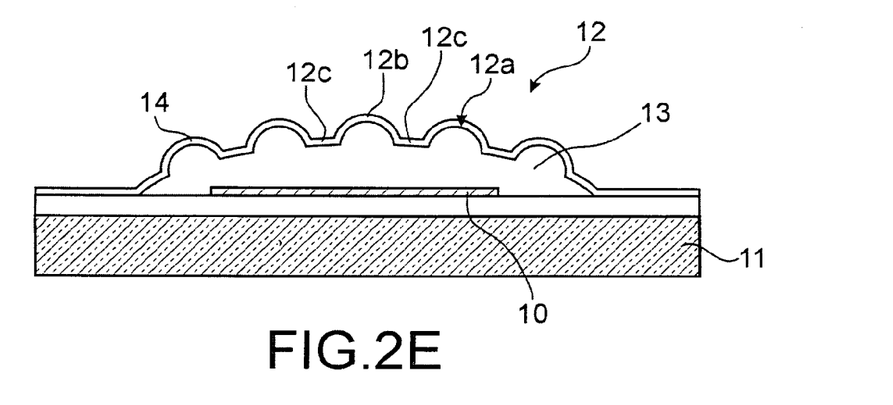
Figure 2F:
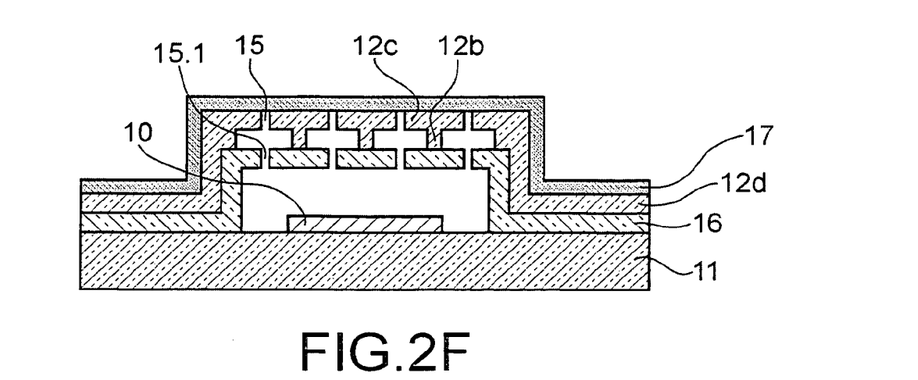

These projecting stiffening members 12b may be represented by a thickening of the top wall 12a as in FIGS. 2B, 2C, 2F or by a curvature of said top wall 12a, in this case, the thickness of the top wall 12a is substantially constant on the projecting stiffening members 12b. The latter configuration is illustrated in FIGS. 2A, 2D, 2E. This curvature may result for example in the protecting stiffening members taking the form of slots or inverted slots.

In some configurations, the cap 12 consists of the top wall 12a and a side wall 12d surrounding the active part 10 and resting on the substrate 11 as in FIGS. 2A, 2B, 2C, 2F. On the other hard, it is possible for the top wall 12a to stretch until the edge thereof rests on the substrate 11.

The projecting stiffening member 12b may have a solid or hollow cross-section depending on whether the top wall 12a has been thickened or simply curved. The cross-section of the projecting stiffening member 12b, whether it is a moulding or a block, may be rectangular, trapezoidal, rounded, U-shaped or another shape.

One or more orifices 15 may be provided in the cap 12 as illustrated in FIG. 2F. The function thereof will be seen below.

It may be envisaged, as illustrated in FIG. 2F, for a lining wall 16 to line the top wall 12a provided with the stiffening means. In this configuration, the projecting stiffening member 12b is projected towards the lining wall 16. This lining wall is located inside the cavity 13, but it may equally well have been envisaged for It to be located outside the cavity 13. The end 14 of the projecting stiffening member 12b comes into contact with the lining wall 16.

The examples in FIG. 2 only illustrate some shapes for the projecting stiffening members, others may be envisaged. These examples are in no way limitative. Moreover, other possible shapes will be seen hereinafter.

The walls 12a, 16 described above may be single-layer or multi-layer.

The top wall 12a and/or the lining wall 16 may for example be made of silicon dioxide $SiO_2$ or silicon nitride SiN or a metal such as nickel, copper, gold or even polysilicon or a combination of these materials.

During the manufacture thereof, the cap 12 and more specifically the top wall 12a thereof comprises at least one orifice 15, used for the evacuation of the sacrificial material used to delimit the shape of the cavity 13. This orifice 15 must be sealed, and the sealing may be carried out by means of a sealing layer 17, comparable to a plug, extending along the top wall 12a, particularly if the orifice 15 passes through the top wall 12a. This configuration is only represented in FIG. 2F as it is the only one of FIG. 2 to display orifices.

In this configuration in FIG. 2F, the lining wall 16 also comprises at least one orifice 15.1 which communicates with the orifice 15 of the top wall 12a. In the other FIG. 2, no orifice has been represented for clarity purposes, emphasis being placed on the top wall. Naturally, these orifices exist and need to be sealed.

Control of the shape of the cap and the choice of materials contained therein and the thickness thereof makes it possible to obtain a suitable mechanical resistance. By adapting the shape of the cap and particularly the shape of the projecting stiffening member, it is possible to increase the resistance of the cap to external pressures compared to a cap according to the prior art of the same thickness. It is also possible to obtain a cap having the same mechanical resistance with a lower thickness.

The lower thickness than. that of the caps according to the prior art offers the advantage of generating lower production costs, the times involved for depositing the wall of the cap and the etching thereof being reduced. In addition, it is known that during the deposition of thick layers, it is difficult to contact the stress of the layer forming the wall, the latter may become detached from the substrate or deformed. Using a thinner layer, these drawbacks are eliminated.

Those skilled in the art are able to calculate the structure of the stiffening means as a function of the stresses of the application thereof such as the desired pressure resistance, the maximum permitted deflection for the cap, the cap size, the mechanical properties and the thickness of the cap material. It is possible to use finite element calculation software such as the simulation software ANSYS (registered trademark of the company ANSYS) On the basis of a given cap geometry (dimensions and shape) and the physical properties of the materials used, the software calculates the deflection of the cap for a given pressure stress. In this way, it is possible to select the structure of the cap, i.e. the number, position and dimensions (height, length, width) of the projecting stiffening members.

A method for manufacturing the cavity 13 wherein the active part 10 of the microcomponent is enclosed and, as a result, a method for manufacturing the cap delimiting same will now be described. The starting point is a substrate 11 whereon the active part 10 rests as illustrated in FIG. 3A. How said active part 10 was obtained is not described in more detail as a wide variety of active parts are suitable.

On the substrate 11, sacrificial material 20 is deposited, in at least one layer, so that it covers the active part 10 and the substrate 11. This sacrificial material 20 will serve to delimit the volume of the cavity created using a shape for the cap.

This sacrificial material 20 may be deposited in a first layer 20.1 referred to as a channel which extends slightly beyond the area of the cavity on the substrate 11, if it decided to position the orifice in a peripheral zone of the cavity and it is necessary to create an evacuation channel. This channel sacrificial layer 20.1 is thin, of the order of a few tenths of micrometres or one micrometre. Typically, it may be between 0.2 and 1 micrometre. The sacrificial material of the channel layer may be a polymer such as a photosensitive resin, e.g. JSR Corporation reference JSR PFR420. This channel layer 20.1 is delimited by means of photolithography on the contour of the area of the cavity and the evacuation channel. Reference may be made to FIG. 3B. This step is unnecessary if the evacuation orifice is not at the base of the cavity. In this case a main sacrificial layer is then produced directly on the surface of the substrate 11 The area of the cavity on the surface of the substrate 11 may be of the order of a few dozen to a few hundred micrometres on the side. It is also possible to use silicon dioxide $SiO_2$ as a sacrificial material. In this case, the shaping is performed by means of dry etching, for example in $CHF_3$ $O_2$ or by means of wet etching with, for example a buried oxide etch solution via a mask.

A main sacrificial layer 20.2 is then deposited which will be used, at least, to delimit the cavity laterally, i.e. delimit the cavity at least partially. This main sacrificial layer 20.2 may be shaped by means of photolithography for example on the lateral contour of the inside of the cavity. Reference may be made to FIG. 3C. The active part 10 is embedded in the main sacrificial layer 20.2. Said main sacrificial layer 20.2 has a thickness of a few micrometres or around ten micrometres above the active part 10 of the microcomponent to be protected. Typically, this thickness may be between 4 and 10 micrometres. This main sacrificial layer 20.2 may be made in the same material as the channel sacrificial layer 20.1 but this is not mandatory as will be seen below.

Figure 3:
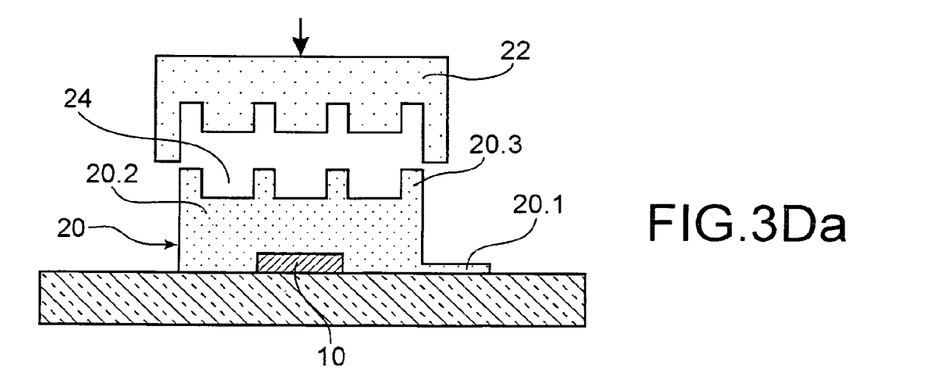
Figure 3A:
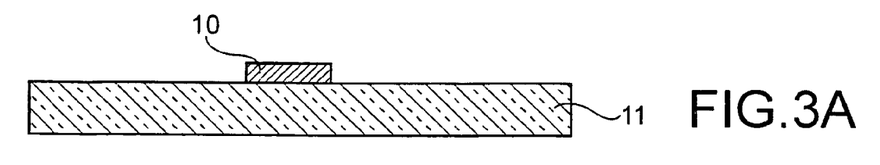
Figure 3B:
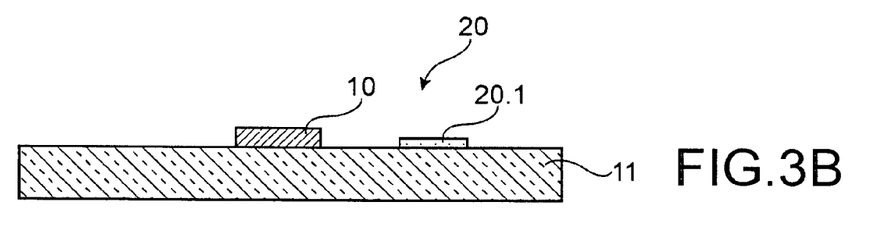
Figure 3C:
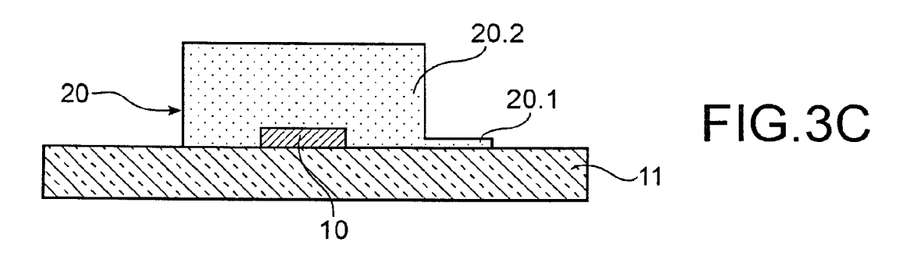

It is assumed in the step illustrated in FIG. 3D*a* that a hollow pattern 24 corresponding to the opposite of that of the projecting stiffening member of the stiffening means is to be produced in the sacrificial material 20. In the example described in FIG. 3D*a*, this pattern 24 will be produced by means of embossing using a tool 22 having a raised pattern which corresponds to that of the stiffening means. Said tool 22 is pressed on the surface of the main sacrificial layer 20.2 and the sacrificial material 20 is deformed by means of creep. This produces, at the top of the main sacrificial layer 20.2, in a hollow, the pattern 24 of the stiffening means. In this case, it is not necessary for the sacrificial material of the main sacrificial layer 20.2 to be photosensitive, it may consist of polyimide if the tool 22 takes the form of a mould wherein the edge helps delimit the cavity laterally.

It is possible to use an additional so-called structuring sacrificial layer 20.3 which is only used to produce the stiffening means. Said structuring sacrificial layer 20.3 is deposited on the main sacrificial layer 20.2. Said layer is delimited and etched for example by means of photolithography with a reverse hollow pattern 24 of that of the stiffening means. This alternative embodiment is illustrated in FIG. 3D*b*. The structuring sacrificial layer 20.3 may be made of polymer, in the same material as the main sacrificial layer 20.2 or in a different material. It must be possible for it to be shaped and etched without degrading the active element 10 and must be compatible with the material of the cap to be added. This remark is applicable to all sacrificial layers. The thickness of the structuring sacrificial layer 20.3 is between approximately 1 and 10 micrometres for example. The width of the projecting stiffening members and therefore of the hollow patterns is also between approximately 1 and 10 micrometres for example.

At least one cap layer 25 will then be deposited to produce the cap and particularly the top part thereof. This layer 25 covers the structuring sacrificial layer 20.3, extends laterally on the main sacrificial layer 20.2 and also covers the channel sacrificial layer 20.1 if it is present. The deposition is a conforming deposition. It may consist of silicon dioxide $SiO_2$, silicon nitride SiN, polycrystalline silicon or metal such as nickel, copper, gold or if there are several layers of an SIN/$SiO_2$ stack, for example. The type of deposition depends on the material deposited. It may consist for metals of electrolytic deposition. For silicon dioxide $SiO_2$, silicon nitride SiN, polycrystalline silicon, it may consist of Plasma Enhanced Chemical Vacour Deposition (known with the abbreviation PECVD) or Low Pressure Chemical Vapour Deposition (known with the abbreviation LPCVD).

The thickness of the cap layer 25 may be between approximately 1 and 3 micrometres for example or even reach up to a few dozen micrometres for metals deposited electrolytically.

Figure 3E:
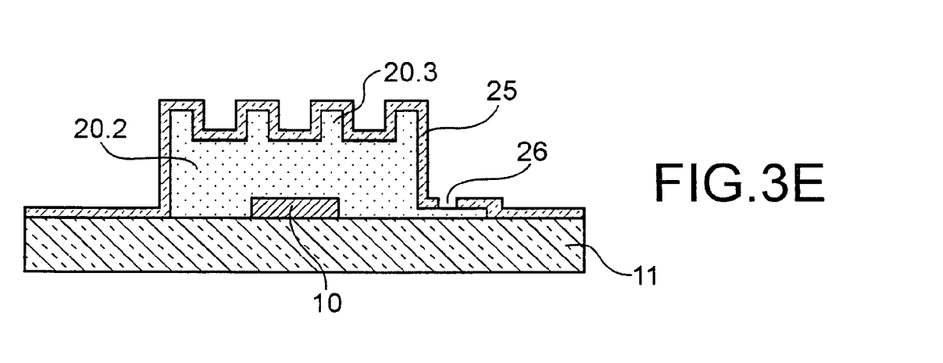

In this cap layer 25, at least one evacuation orifice 26 of the sacrificial material will be etched so as to empty the cavity. in the example in FIG. 3E, this evacuation orifice 26 is located at the point where the channel layer 20.1 is not covered by the main sacrificial layer 20.2, at the periphery of the cavity. In another configuration such as that in FIG. 4D, this evacuation orifice is located on the top wall.

Figure 3F:
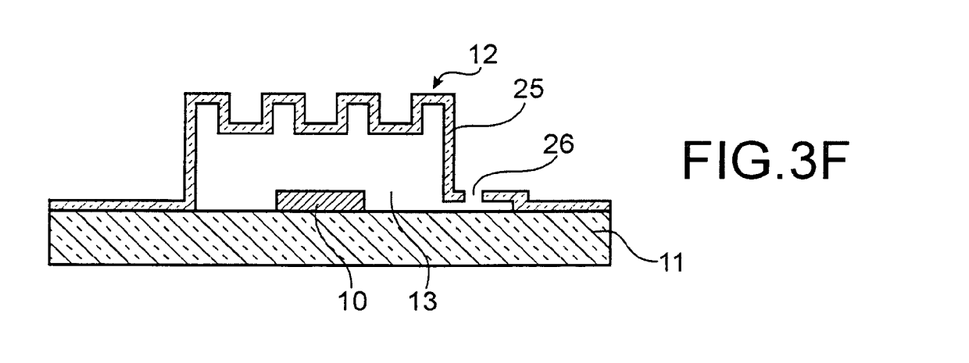

The sacrificial material 20 will then be removed by evacuating it via the opening 26 so as to empty the cavity. This evacuation may be performed by means of exposure to an oxygen plasma, which removes the organic residue provided that the sacrificial material is a polymer. If the sacrificial material is a silicon dioxide, it may be dissolved using a hydrofluoric acid HF-based solution. Reference may be made to FIG. 3F which illustrates the released cavity 13.

Figure 3G:
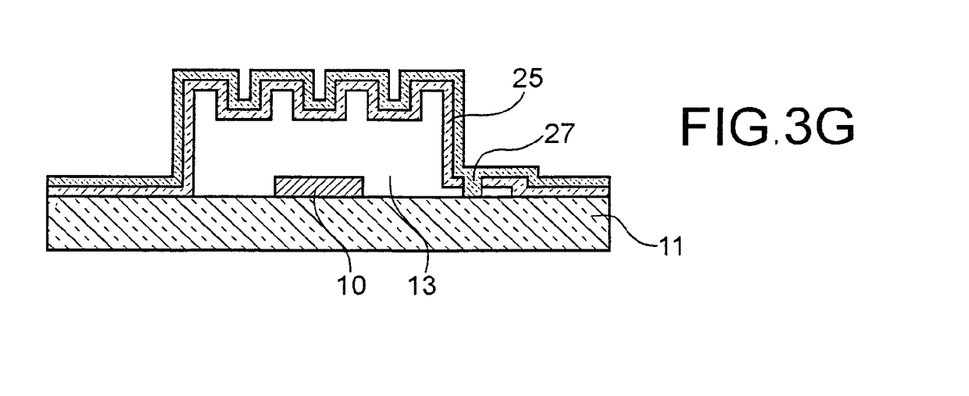

The orifice 26 will now be sealed as illustrated in FIG. 3G. This sealing may render the cavity 1.3 hermetic. This sealing may be performed by depositing at least one sealing layer 27 on top of the cap layer 25. This layer may be made of silicon dioxide $SiO_2$, silicon nitride, polymer such as polyimide or benzocyclobutene BCB, silicone, metal such as nickel, copper or gold. If there are several layers, they may be selected from these materials. The thickness of the sealing layer 27 may be between one micrometer and fifty micrometres. For example, if it consists of a multi-layer of SIN/$SiO_2$ or a layer of SiN, the thickness may be between 1 and 3 micrometres, for the polymer, it is possible to be within a range between approximately 5 and 30 micrometres and for silicone, the range may be between approximately 5 and 50 micrometres. The sealing layer 27 may be etched everywhere except on top of a region on top of the orifice(s) 26 to form a localised plug 27.1 on top of each orifice 26. This alternative embodiment is illustrated in FIG. 4F.

Figure 4A:
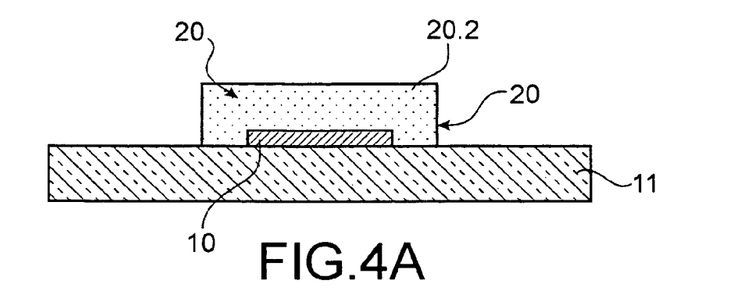
FIGS. 4A to 4F illustrate another example of steps of the production of a microcomponent provided with a cavity delimited by a cap according to the invention.
Figure 4B:
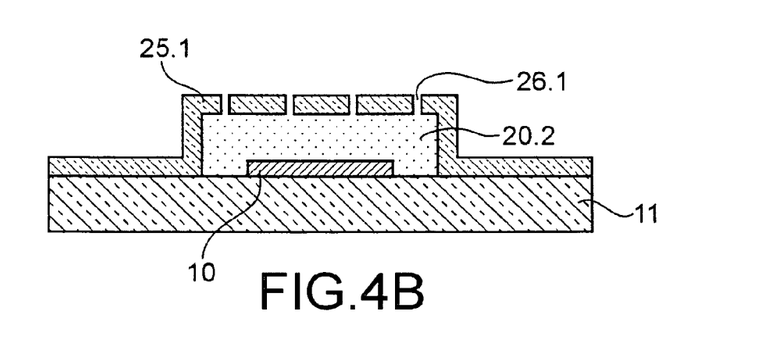
Figure 4C:
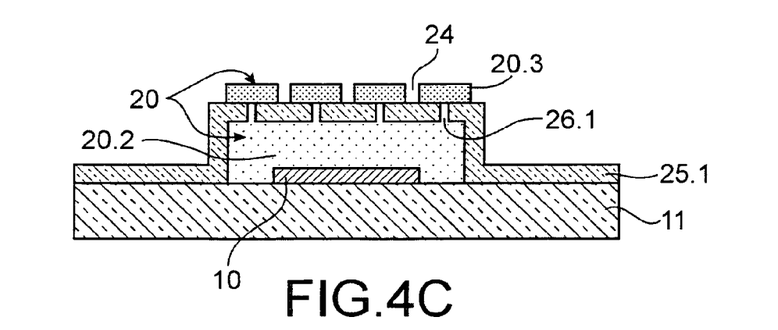
Figure 4D:
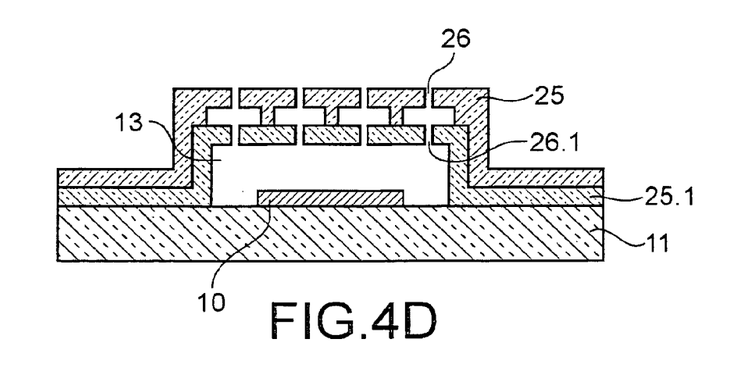
Figure 4E:
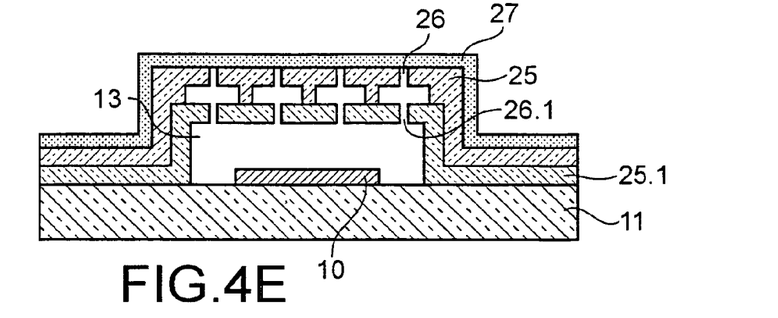
Figure 4F:
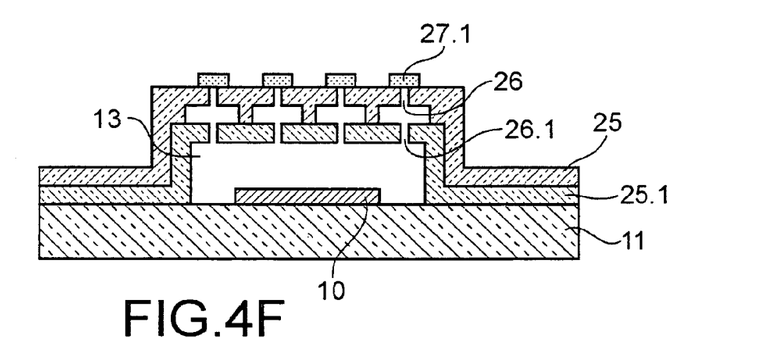

FIGS. 4A to 4A illustrate another example of an embodiment of the cavity. This embodiment results in the structure Illustrated in FIG. 2F and the top wall supporting the stiffening means is lined by a lining wall.

It is assumed that, in this example, at least one evacuation orifice has been placed on the top wall and therefore the channel sacrificial layer is omitted.

The main sacrificial layer 20.2 is then produced as described above. It is covered with at least one lining layer 25.1 which may be made using the materials cited above for the cap layer. One or more orifices 26.1 are etched in this lining layer 25.1. On the lining layer 25.1, the structuring sacrificial layer 20.3 is then deposited, which is shaped and wherein the stiffening means pattern 24 is etched. This step is illustrated in FIG. 4C.

At least the cap layer 25 is then deposited on the structuring sacrificial layer 20.3. This cap layer 25 is provided with stiffening means. It leads to the top part of the cover. In the cap layer 25, one or more orifices 26 are etched, positioned so that the sacrificial material of the main sacrificial layer 20.2 can be evacuated via the orifices 26.1 of the lining layer 25.1 and via the orifices 26 of the cap layer 25. The sacrificial material 20 is removed as described in the above example. The orifices are sealed by depositing a sealing layer 27 on top of the cap layer 25 as illustrated in FIG. 4E. It is then possible, by means of etching of the sealing layer 27, to produce localised plugs 27.1 as described above. This step is illustrated in FIG. 4F.

Several shapes for projecting stiffening members of the stiffening means will now be given with reference to FIGS. 5. These figures illustrate a top view of the pattern which is etched in the structuring sacrificial layer to obtain these stiffening means. In these figures, the structuring sacrificial layer is represented greyed and the white parts illustrate the main sacrificial layer which appears once the pattern has been etched in the structuring sacrificial layer.

Figure 5A:
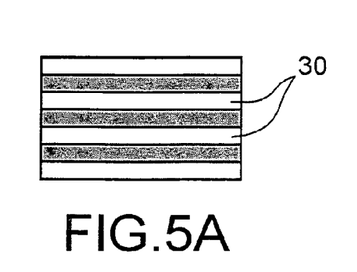
FIGS. 5A to 5D illustrate various examples of hollow patterns used to produce stiffening means of the cover of the microcomponent according to the invention.

In FIG. 5A, parallel grooves 30 have been etched in the structuring sacrificial layer. The top wall of the cap will comprise parallel mouldings which correspond to the inner volume of the grooves. This configuration is suitable for caps wherein the top wall is rectangular. These mouldings follow the edge of the top wall.

Figure 5B:
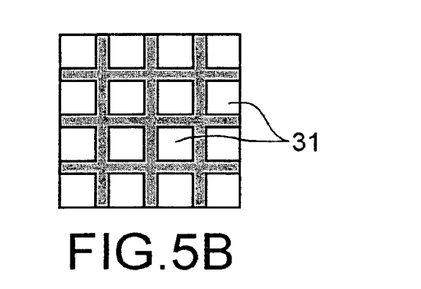

In FIG. 5B, troughs 31 with a substantially square cross-section have been etched, these troughs 31 being arranged substantially regularly in rows and in columns. Two series of mouldings have been retained in the material of the structuring sacrificial layer. The mouldings of one series are substantially parallel. The mouldings of one series and the mouldings of the other series intersect substantially at right angles. The stiffening members will be blocks arranged in rows and an columns. This configuration is particularly suitable for caps wherein the top walls are substantially square.

Figure 5C:
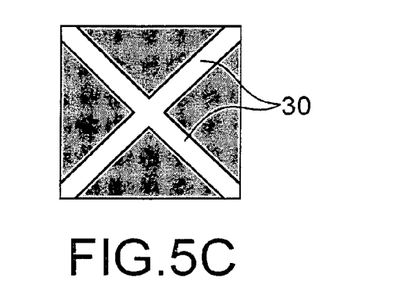

In FIG. 5C, two grooves 30 which intersect in the structuring sacrificial layer and form a cross have been etched. These grooves 30 are a top view of the diagonals of the cross-section of the structuring sacrificial layer. The stiffening members will be two mouldings which form a cross. This configuration is of particular interest when the top wall is convex in the form of an arch. The area of the cap on the substrate being substantially square.

Figure 5D:
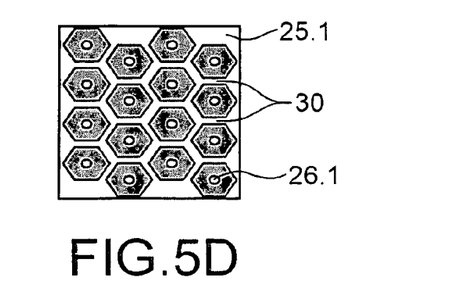

FIG. 5D may illustrate the configuration of the FIG. 4 but it is not mandatory. If this Is the case, the white part illustrates the lining layer which is stripped by etching the structuring sacrificial layer Honeycombed grooves 30 have been etched in the structuring sacrificial layer. The stiffening members will be honeycombed mouldings. The first orifices 26.1 located in the lining layer have also been represented.

The various alternative embodiments described should be understood as not being mutually exclusive.

Although several embodiments of the present invention have been represented and described in detail, it will be understood that various changes and modifications may be made without leaving the scope of the invention.

The invention claimed is:

1. Microcomponent comprising a cavity (13) delimited by a cap (12) enclosing an active part (10) supported by a substrate (11), wherein the cap (12) comprises a top wall (12a) comprising stiffening means with at least one projecting stiffening member (12b), said stiffening member (12b) being located between two recessed areas (12c) of the top wall (12a) and having one end (14) at a distance from the recessed areas (12c) without coming into contact with the substrate (11), wherein the projection of the stiffening member is formed by the curvature of the top wall, the thickness of the top wall with the stiffening member being substantially constant.

2. Microcomponent according to claim 1, wherein projecting stiffening member (12b) is a moulding or a block.

3. Microcomponent according to claim 2, wherein the moulding or block has a rectangular, trapezoidal or rounded cross-section.

4. Microcomponent according to claim 2, wherein the top wall (12a) comprises several substantially parallel mouldings along the edge of the top wall (12a).

5. Microcomponent according to claim 2, wherein the top wall (12a) comprises two mouldings arranged crosswise.

6. Microcomponent according to claim 2, wherein the top wall (12a) comprises several honeycombed mouldings.

7. Microcomponent according to claim 2, wherein the top wall (12a) comprises a plurality of blocks arranged in a matrix.

8. Microcomponent according to claim 1, wherein the projecting stiffening member (12b) is facing either the inside or the outside of the cavity (13).

9. Microcomponent according to claim 1, wherein the end (14) of the projecting stiffening member (12b) is free.

10. Microcomponent according to claim 1, wherein the cap (12) comprises a lining wall (16) which lines the top wall (12a), the end (14) of the projecting stiffening member (12b) being in contact with the lining wall (16).

11. Microcomponent according to claim 1, wherein the top wall (12a) comprises at least one orifice and the lining wall (12c) comprises at least one orifice the orifice of the top wall (12a) and the orifice of the lining wall (16) communicating with each other.

12. Microcomponent according to claim 11, wherein the orifice of the outermost wall of the cap (13), between the top wall (12a) and the lining wall (16), is flanked by a plug.

13. Method for manufacturing a cavity of a microcomponent delimited by a cap (12) according to claim 1, comprising the following steps:
deposition of sacrificial material (20.1, 20.2, 20.3) on the substrate (11) and on the active part (10) of the microcomponent,
delimitation of the sacrificial material and production on the surface of at least one reverse hollow pattern (24) of that of the projecting stiffening member of the stiffening means,
deposition on the sacrificial material (20) of at least one cap layer (25) forming the cap and the top wall,
creation of at least one orifice (26) in the cap layer (25),
evacuation of the sacrificial material (20) via the orifice (26),
sealing of the orifice (26).

14. Method according to claim 13, wherein the hollow pattern (24) is produced by means of embossing in the sacrificial material (20).

15. Method according to claim 13, wherein the sacrificial material (20) is deposited in several layers (20.1, 20.2) wherein a first so-called channel layer (20.1) is used to model a sacrificial material evacuation channel, arranged on the periphery of the cavity.

16. Method according to claim 13, wherein the sacrificial material (20) is deposited in several layers (20.2, 20.3) including a main sacrificial layer (20.2) which is partially used as a mould for the cap, said main sacrificial layer (20.2) being topped by a structuring sacrificial layer (20.3) wherein the hollow pattern (24) is produced.

17. Method according to claim 16, wherein at least one lining layer (25. I) is deposited on the main sacrificial layer (20.2), before the deposition of the structuring sacrificial layer (20.3), said lining layer (25.1.) serving to produce the lining walls.

18. Method according to claim 17, wherein at least one orifice is produced in the lining layer (25.1) for the evacuation of the sacrificial material (20), said orifice (26.1) communicating with the orifice (26.2) of the cap layer (25).

19. Method according to claim 13, wherein the orifice (26) of the cap layer (25) is sealed by depositing at least one sealing layer (27) on the cap layer (25).

20. Method according to claim 19, wherein the sealing layer (27) is etched with the exception of a region above the orifice (26) to produce a plug (27.1) on top of the orifice.

* * * * *